US006373415B1

(12) United States Patent
King et al.

(10) Patent No.: US 6,373,415 B1
(45) Date of Patent: Apr. 16, 2002

(54) DIGITAL PHASE COMPENSATION METHODS AND SYSTEMS FOR A DUAL-CHANNEL ANALOG-TO-DIGITAL CONVERTER

(75) Inventors: Eric T. King, Temple; Douglas F. Pastorello, Hudson, both of NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/484,480

(22) Filed: Jan. 18, 2000

Related U.S. Application Data

(63) Continuation-in-part of application No. 09/405,370, filed on Sep. 24, 1999.

(51) Int. Cl.[7] .................................................. H03M 1/06
(52) U.S. Cl. ........................................ 341/118; 341/120
(58) Field of Search ................................ 341/118, 120, 341/61, 155, 143; 364/483

(56) References Cited

U.S. PATENT DOCUMENTS 4,530,107 A * 7/1985 Williams ..................... 377/44
5,017,860 A * 5/1991 Germer et al. .............. 324/142
5,124,656 A * 6/1992 Yassa et al. ................ 328/155
5,485,393 A * 1/1996 Bradford ..................... 364/483

* cited by examiner

*Primary Examiner*—Peguy Jeanpierre
*Assistant Examiner*—Joseph Lauture
(74) *Attorney, Agent, or Firm*—McDermott, Will & Emery; Steven Lin

(57) ABSTRACT

Phase compensation in a dual-channel analog-to-digital converter (ADC) is accomplished by holding conversion results in programmable length registers for controllable time periods. A dual-channel ADC includes first and second delta-sigma modulators and a digital filter, subject to multiple sampling rates for optimizing coarse and fine adjustments of delay. An energy calculation is performed in a sampled data domain, which is implemented using digital multiplication techniques in a delay compensation scheme performed in the digital domain. The digital data subject to filter processing, is delayed by predetermined amounts. The dual-channel ADC is provided with a programmable channel delay mechanism. A differential delay equal to ΔI–ΔV is calibrated and compensated subject to an acceptable time delay for production of a correct energy value. The ADC according to the present invention further oversamples received analog signal at clock rates much higher than the output rate of the ADC, and delays are generated in the downstream filters connected to the ADC's.

31 Claims, 13 Drawing Sheets

| DCLK | FSIG | PHASE SHIFT CONTRIBUTION, IN DEGREES, BY CLOCK HICLK | MDCLK | LOCLK |
|---|---|---|---|---|
| | | 8x | | |
| 4.096 M | 45 | .03 (.25) | 2.02 | 4.05 |
| | 66 | .05 (.37) | 2.97 | 5.94 |
| 5.000 M | 45 | .03 (.21) | 1.66 | 3.32 |
| | 66 | .04 (.30) | 2.43 | 4.87 |
| 2.500 M | 45 | .05 (.41) | 3.32 | 6.64 |
| | 66 | .08 (.61) | 4.87 | 9.73 |

| B3 | B2 | B1 | B0 | Y2 | Y1 | TOTAL DELAY | NORMALIZED DELAY |
|---|---|---|---|---|---|---|---|
| 0 | 0 | 0 | 0 | D9 | D0 | 64 | 0 |
| 0 | 0 | 0 | 1 | D9 | D1 | 72 | 8 |
| | • | | | • | • | • | • |
| | • | | | • | • | • | • |
| | • | | | • | • | • | • |
| 0 | 1 | 1 | 1 | D9 | D7 | 120 | 56 |
| 1 | 0 | 0 | 0 | D8 | D0 | 0 | -64 |
| 1 | 0 | 0 | 1 | D8 | D1 | 8 | -56 |
| | • | | | • | • | • | • |
| | • | | | • | • | • | • |
| | • | | | • | • | • | • |
| 1 | 1 | 1 | 1 | D8 | D7 | 56 | -8 |

*Fig. 7B*

DIGITAL PHASE COMPENSATION METHODS AND SYSTEMS FOR A DUAL-CHANNEL ANALOG-TO-DIGITAL CONVERTER

CROSS REFERENCE TO RELATED APPLICATIONS

This application is a continuation-in-part application of patent application Ser. No. 09/405,370 entitled "*Energy-to-Pulse Converter System, Device and Methods wherein the Output Frequency is greater than the Calculation Frequency, and having Output phasing*, having inventors Doug Pastorello and Eric T. King, and having been filed on Sep. 24, 1999, and is related to patent application Ser. No. 09/484,866, entitled "*A Delay Correction System and Method for a Voltage Channel in a Sampled Data Measurement System*" having inventors Eric T. King and Doug Pastorello and having been filed on Jan. 18, 2000 and each incorporated herein by reference in its entirety.

BACKGROUND OF THE INVENTION

1. Field of the Invention

The invention generally relates to analog-to-digital converters and more particularly to phase equalization in a dual-channel analog-to-digital converters 2. Description of Related Art Energy calculations for electric power loads are made by power meters of all kinds. Until recently, electromechanical power meters were exclusively employed in millions of homes and businesses worldwide to monitor the amount of power consumption by a user at a particular location. Such monitoring allows the electricity/power entities to monitor the power (energy) usage of the user for proper billing, load monitoring, servicing, etc. In electromechanical power meters, a series of electrical components as well as mechanical disks, gears, indicators, and dials are used to convert voltage and current into energy. In addition to low accuracy, these electromechanical power meters also require periodic manual calibration and check-ups by field service technicians to ensure that they are operating properly. Electronic meters have recently begun to replace electromechanical meters in monitoring power consumption for homes and businesses. In general, because they rely on digital rather than electromechanical components, electronic meters are more accurate and reliable than their counterpart electromechanical meters. Additionally, through networking, electronic meters allow calibration and monitoring check-ups to be performed from a remote location such as a central office thereby greatly reducing the on-site visits by field service technicians. Finally, due to the deregulation of the electricity market already underway in the United States and Europe, broader range of information on consumers' power use is needed by competing power suppliers for customizing the billing and servicing plan for each consumer. Due to these advantages, in the near future, electronic meters will likely replace all of the 60 million electromechanical power meters that are in use today in industrial and residential applications. In general, electronic power meters uses sensors such as transformers, etc. to measure the analog current and voltage from the power lines which are then converted into digital words using analog-to-digital converters (ADCs). A power value P is then computed using the converted digital current words and converted digital voltage words according to the equation P=V*I wherein V represents voltage and I represents current. However, the measurement process and conversion process may introduce delays into signals carrying the digital voltage words and digital current words which can cause the signals to be out of phase relative to each other. One technique to equalize the phase change involves making compensation to the sensors. This technique, however, may be expensive because it requires making physical adjustments to passive devices. Another technique to equalize the phase change involves scaling the power output value by a predetermnined scaling factor after it has been computed. This technique is based upon the power equation P=I*V*cosφ that relates voltage V, current I, and the phase angle φ between I and V. According to this technique, the power value P is divided by the factor cosφ to compensate for the phase difference between I and V. This requires prior knowledge of the phase angle φ. However, the phase angle φ is a function of frequency which may drift over time thereby making the scaling factor cosφ a variable. As such, the power value computed using a fixed scaling factor cosφ may be inaccurate under this technique. In addition, an actual phase angle (φ) between the current and voltage may exist as the load becomes less resistive. This also will produce an error in the computed power value.

The energy consumed by a particular electric power load can be calculated according to the following formulas:

$$E=\int_{ti}^{tf} P(t)dt$$

and $$E=\int_{ti}^{tf} I(t)V(t)dt$$

The energy calculation can be carried out in a sampled data domain, permitting digital multiplication. The measurement system, including sensors and analog-to-digital converters (ADCs), contributes delays of ΔV and ΔI to the voltage and current channels. These delays produce an error in the energy calculation, as illustrated in the waveforms of FIG. 2. The error results in a difference in calculated watt-hours between watt-hours calculated with and without delays. In the past, the sample clock for the ADCs has been shifted, making necessary the design of a complex clock generator, not only for the ADCs but for any filters in the signal paths. For example, see U.S. Pat. No. 5,017,860.

SUMMARY OF THE INVENTION

According to the present invention, phase compensation in a dual-channel analog-to-digital converter (ADC) is accomplished by holding conversion results in programmable length registers for controllable time periods. According to one embodiment of the present invention, a dual-channel ADC includes first and second delta-sigma modulators and digital filters, subject to multiple sampling rates for optimizing coarse and fine adjustments of delay. Further according to the present invention, an energy calculation is performed in a sampled data domain, which is implemented using digital multiplication techniques in a delay compensation scheme performed in the digital domain. In particular according to the present invention, the digital data subject to filter processing is delayed by predetermined amounts. According to the present invention, the dual-channel ADC is provided with a programmable channel delay mechanism. With such a controllable delay mechanism, there is no need to provide off-chip compensation in sensors used to receive analog signals of interest.

Such an off-chip mechanism is costly and requires burdensome physical adjustment of passive devices. Further, there is no need to scale the energy output after it has been calculated. Calculations according to the present invention moreover are further not limited to just one frequency. According to the present invention there is further no need to shift the sample clock of the ADCs, which would require a complex clock generator not only for the ADC components but for any filters in the signal paths of interest. Further, according to the present invention, a differential delay equal to ΔI–ΔV is calibrated and compensated subject to an acceptable time delay for production of a correct energy value. The ADC according to the present invention further oversamples received analog signal at clock rates much higher than the output rate of the ADC, and delays are generated in the downstream filters connected to the ADC's. Thus according to the present invention, the analog signals are left alone and not adjusted. Instead, the data which comes out of the analog circuitry is treated as normal, and delay circuitry is connected between the filter circuitry in the present embodiment.

BRIEF DESCRIPTION OF THE DRAWINGS

FIG. 7B is a chart relating values of B3B2B1B0 to Y2, Y1, total DELAY, and the delay normalized to B=0 (NORM);

DETAILED DESCRIPTION OF THE INVENTION

Figure 1A:
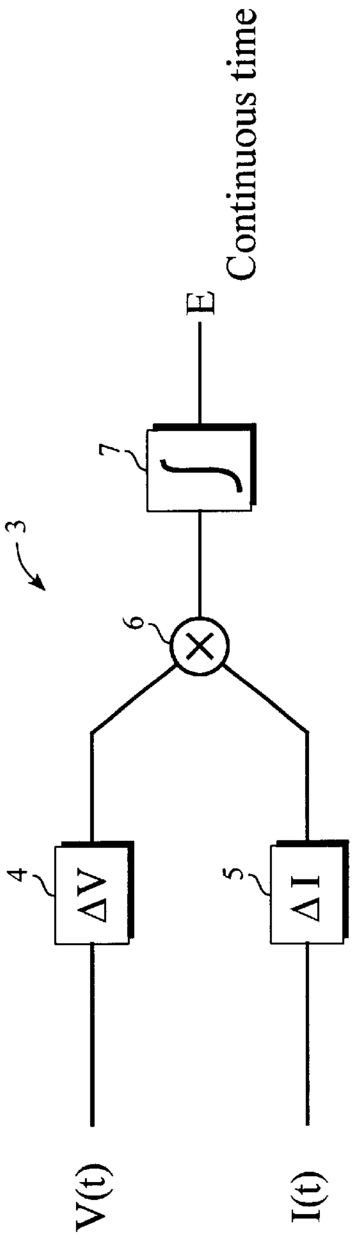
FIG. 1A is a diagram of a continuous time measurement system according to the present invention, including sensors and ADCs, in which the measurement system contributes delays of ΔV and ΔI to the voltage and current channels.

Referring now to FIG. 1A, there is shown a block diagram of a continuous time measurement system 3 with lumped delay to represent delays in sensors and ADCs, shown as ΔV and ΔI in the voltage and current channels. In particular, the continuous time measurement system 3 includes a voltage channel delay 4, a current channel delay 5, a multiplication node 6, and an integrator 7. The multiplication node 6 is connected to the outputs of the voltage and current blocks 4 and 5. The integrator 7 is connected to the output of the multiplication node 6. The integrator 7 produces an output energy (E) signal value.

Figure 1B:
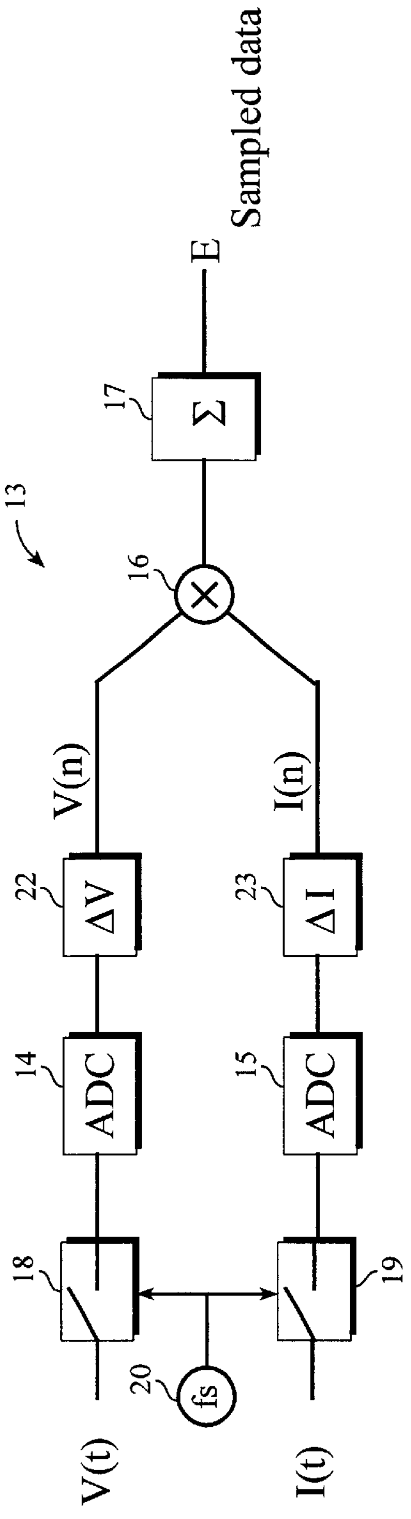
FIG. 1B is a diagram of a sampled data measurement system according to the present invention, including sensors and ADCs, in which the measurement system contributes delays of ΔV and ΔI to the voltage and current channels.

Referring now to FIG. 1B, there is shown a diagram of a sampled data measurement system 13 according to the present invention, with lumped delays V and I to represent delays in the sensors and ADCs of to the voltage and current channels. In particular, the sampled data measurement system includes a voltage channel delay 14, respectively first and second sampling switches 18 and 19, a frequency source 20 connected to said first and second sampling switches 18, 19, a current channel delay 15, a multiplication node 16, and a summation block 17. The multiplication node 16 is connected to the outputs of the voltage and current channel delays 14 and 15. The summation block 17 is connected to the output of the multiplication node 16. The summation block 17 produces an output energy (E) signal value based upon sampled data.

Figure 2A:
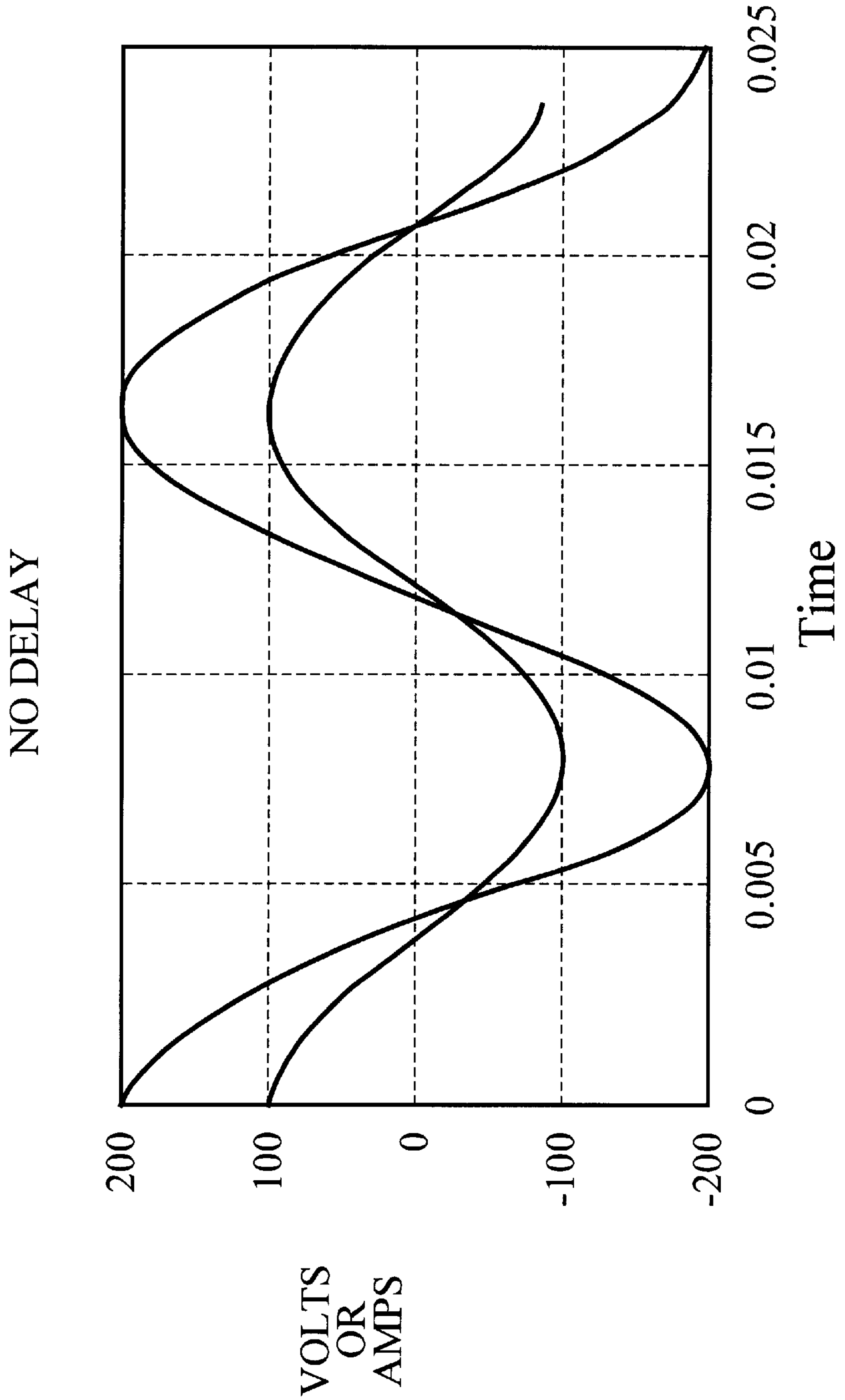
FIGS. 2A through 2F are diagrams of waveforms showing the errors in calculations resulting from delays of ΔV and ΔI in the voltage and current channels of the ADC system.
Figure 2B:
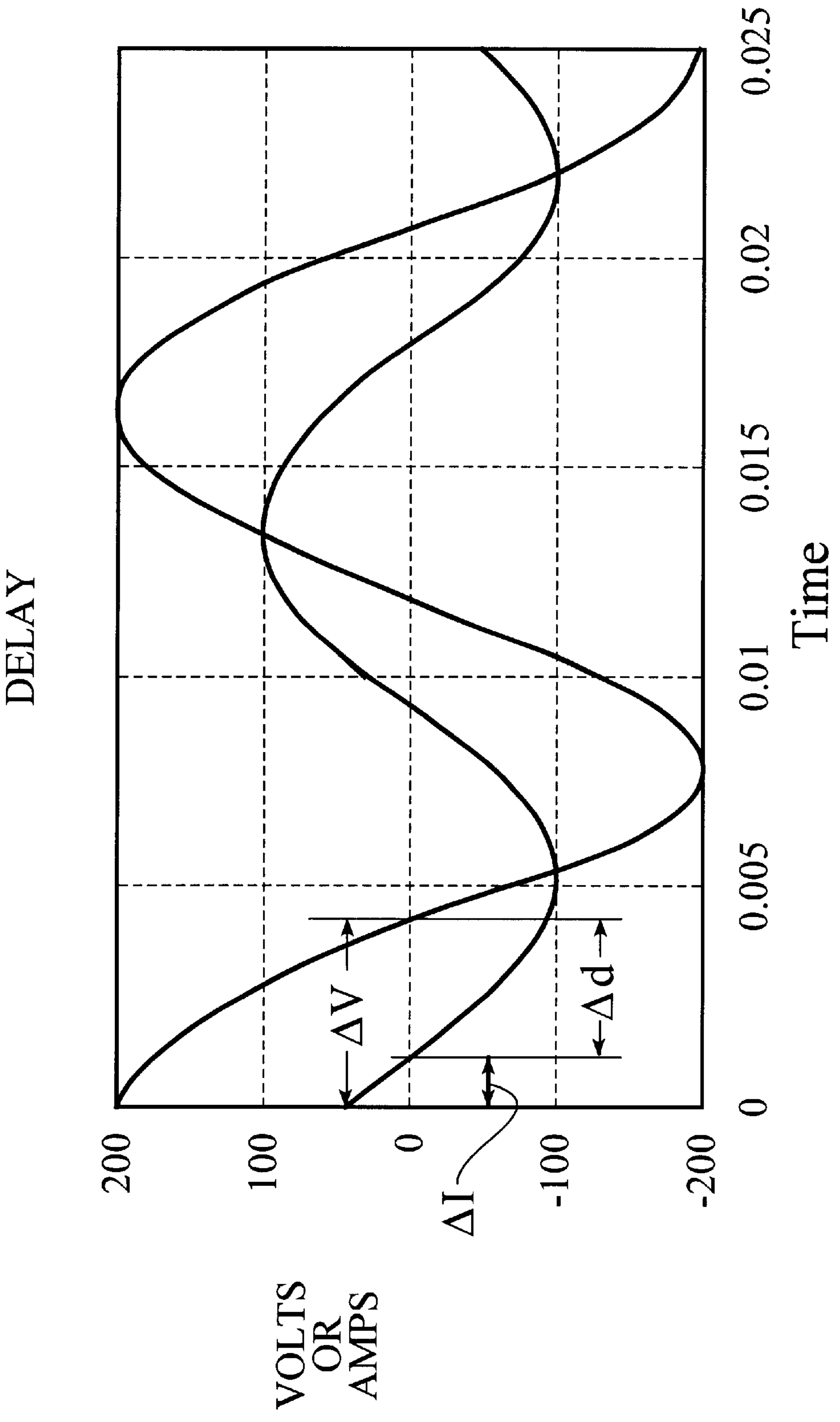
Figure 2C:
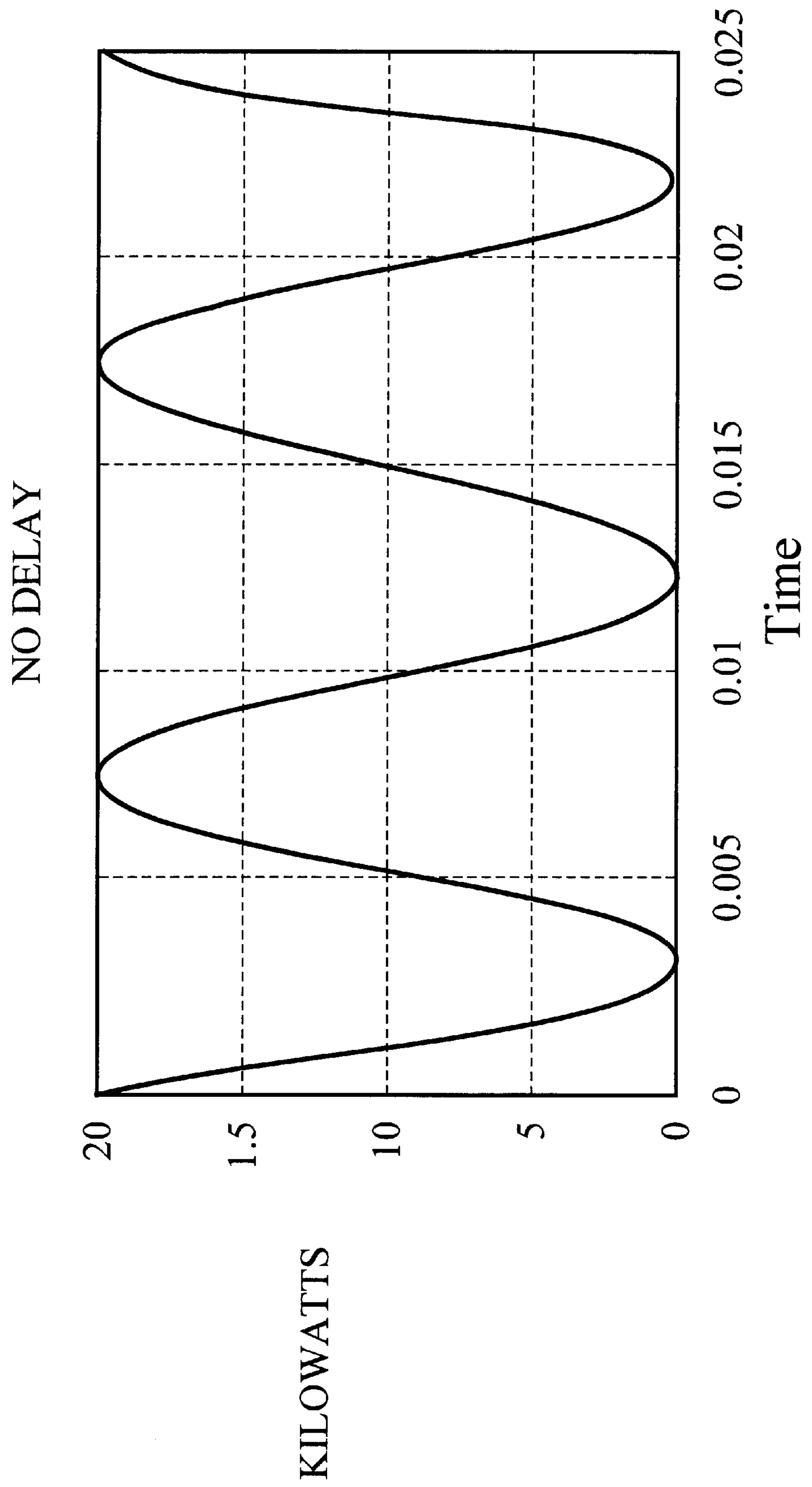
Figure 2D:
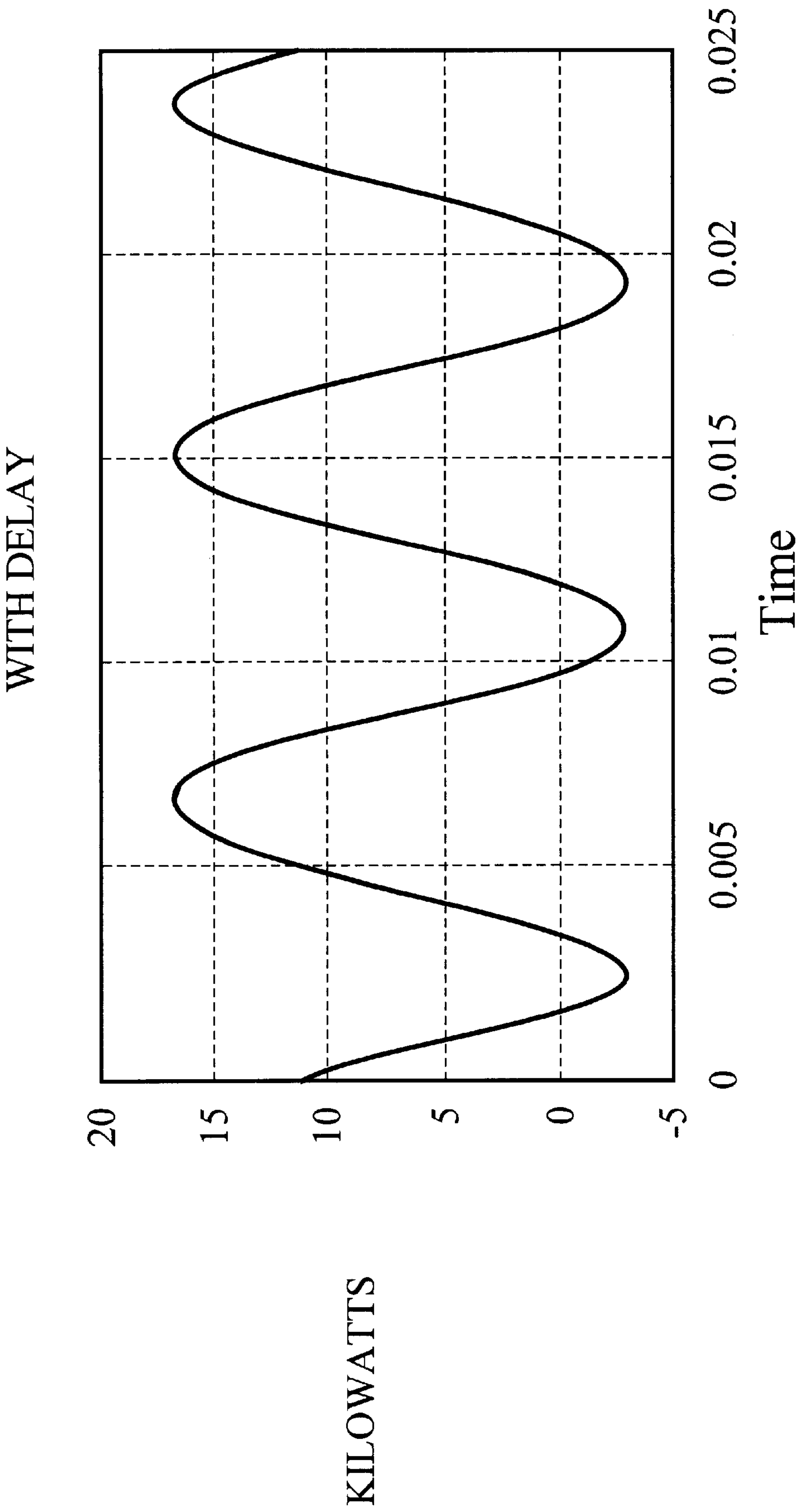
Figure 2E:
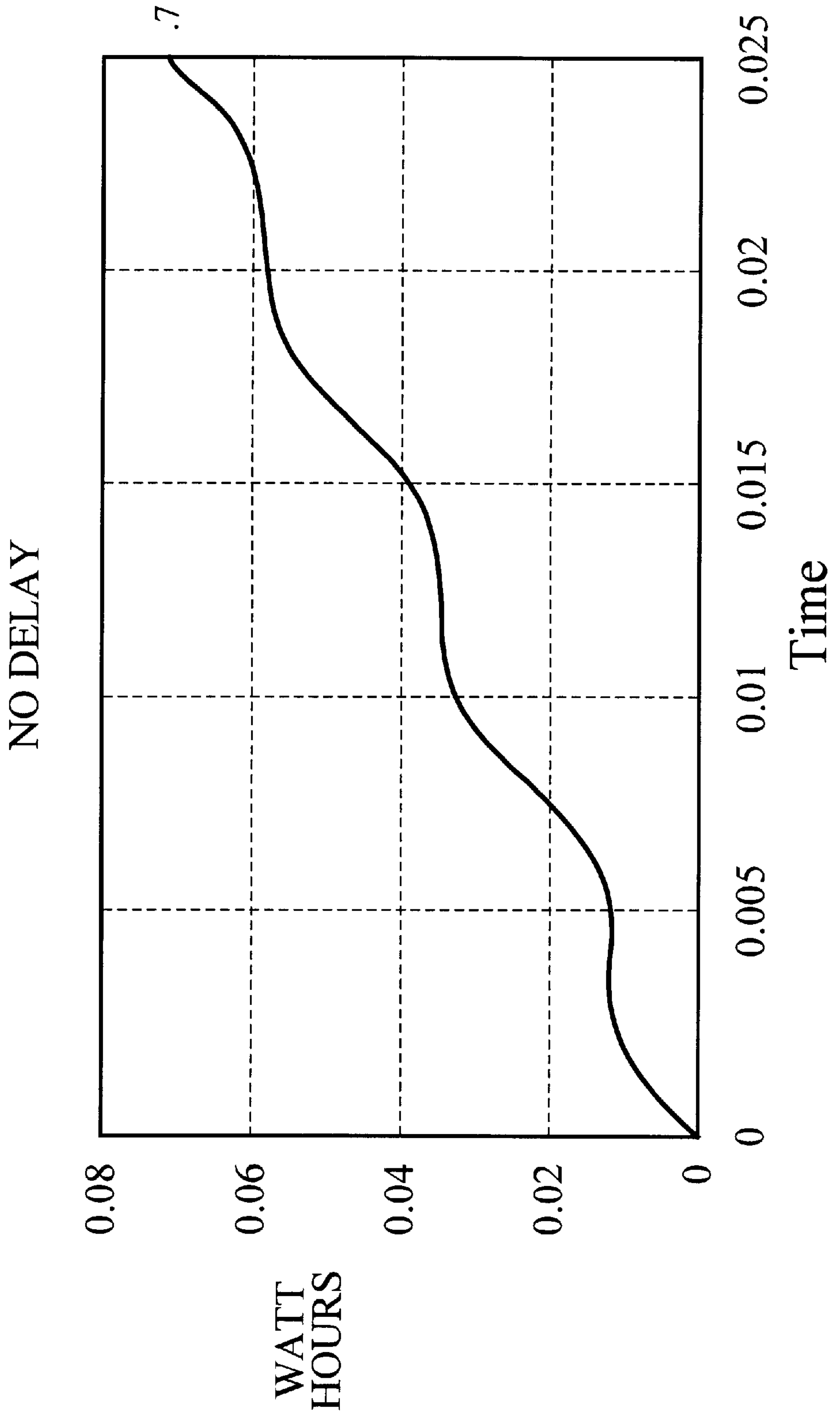
Figure 2F:
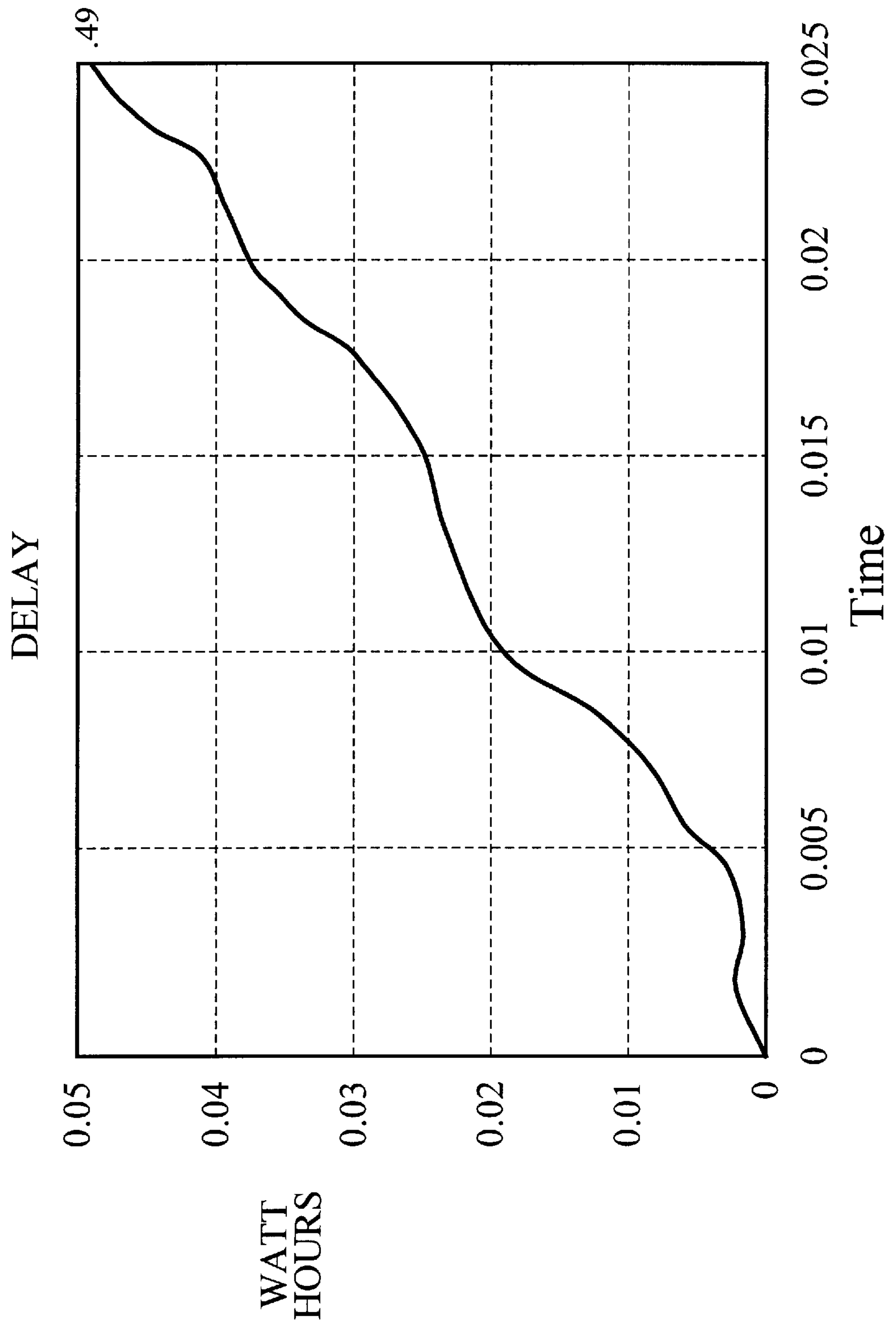

Referring now to FIGS. 2A through 2F are diagrams of waveforms showing the errors in energy calculations resulting from delays of ΔV and ΔI in the voltage and current channels of the ADC. In particular, FIG. 2A is a diagram of an undelayed voltage and current signal according to a sinusoidal format. FIG. 2B are delayed current and voltage signals according to the format of the undelayed sinusoidal indicated in FIG. 2A. FIGS. 2C and 2D are corresponding undelayed and delayed power curves. Finally, FIGS. 2E and 2F are corresponding undelayed and delayed energy curves.

Figure 3:
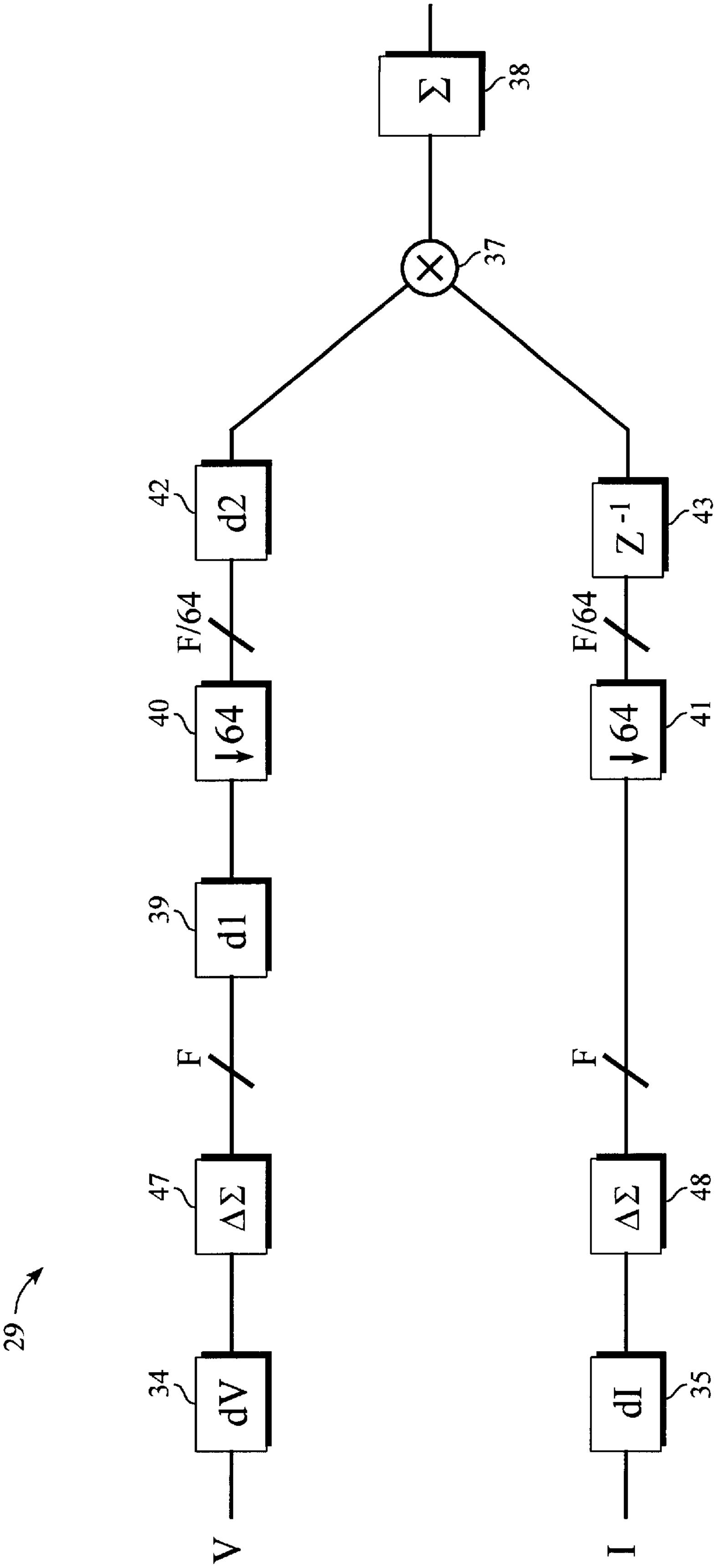
FIG. 3 is an uncorrected voltage channel in an ADC. converter system, according to the prior art.

Referring now to FIG. 3, there is shown a phase compensation system 29 according to the present invention, in which programmable delay is added in two places, d1 and d2. In FIG. 3, there is shown a phase compensation system 29 according to the present invention, including sensors and ADCs, in which the delays of ΔV and ΔI to the voltage and current channels are compensated. In particular, the phase compensation system 29 includes a voltage delay 34, a current delay 35, first and second delta-sigma analog-to-digital converters respectively 47 and 48, first and second adjustable delay registers 39 and 42 respectively, first and second decimators 40 and 41, a current delay 35, a delay register 43, a multiplication node 37, and a summation block 38. The delta sigma analog to digital converters 47, 48 convert analog signals received from the respective voltage and current delays 34, 35, at a first frequency F. After conversion, the frequency is stepped down by a factor of 64 by respective decimators 40, 41. In particular, the frequency is stepped down by the factor of 64 between delay elements 39 and 42. To compensate for time delay, only one path needs to be subject to compensation. The voltage channel is selected as its resolution is not as great at the current channel, therefore requiring less silicon area for the delay registers. Programmable delay is added in two places, d1 and d2, respectively 39 and 42. The clock rate for these delay cells 39, 42 is f and f/64 respectively. The multiplication node 37 is connected to the outputs of the second delay element 42 and the output of the delay register 43. The summation block 38 is connected to the output of the multiplication node 37. The summation block 38 produces an output energy (E) signal value based upon sampled data. The two phases corresponding to the two channels are substantially equal but adjustments are made according to the present invention to at least one selected channel to enable calibrating out errors that are externally derived with respect to the ADC. According to another embodiment of the present invention, first and second ADCs use different filters, each of which is provided with a separate adjustment delay on at least one channel for each filter to ensure phase adjustment according to the present invention. External compensation for the chip (e.g., the sensor) can be provided according to the present invention. Once E is calculated, a predetermined compensation factor can be used to compensate the phases according to one embodiment of the present invention. The following equation relates energy to I and V in view of the delay between current and voltage: $E=I*V*\cos\phi$ where $\phi$ is the angle between I and V. In these filters, there is a fixed amount of time that one channel is delayed relative to the other channel. Depending on the phase error in the sensor, at one frequency, voltage and current are in phase, while at another frequency, voltage and current are at different phases. The oscillation frequency of V and I (e.g., 50 or 60 Hz) comes out of a wall socket, for example. In the US, the wall frequency is usually 60 Hz and in Europe it is usually 50 Hz. According to the equation above, the compensating factor between voltage and current is cost. According to the present invention, an ADC oversamples at a clock rate in excess of the output rate of the ADC to enable generation of delays for use in downstream filters. According to one embodiment, the ADCs 47, 48 run at the Nyquist rate. The total adjustable delay is d1+d2. The fixed or matching delay in the current channel is 64/f.

According to the present invention, the natural delay of the second channel is longer than the delay of the first channel. Since the second channel delay is the current and the first channel delay is the voltage, the natural delay of the current channel is longer than the natural delay of the voltage channel. This additional delay is represented in FIG. 3 by delay block 43. Without additional, programmable, compensation, the output of the second channel would lag the output of the first channel. By increasing the delay in the first channel, the phase relationship can be moved from lagging (a negative offset) to leading (a positive offset). This fall range of adjustment can be accomplished by adding programmable delay in only one of the channels.

Figure 4:
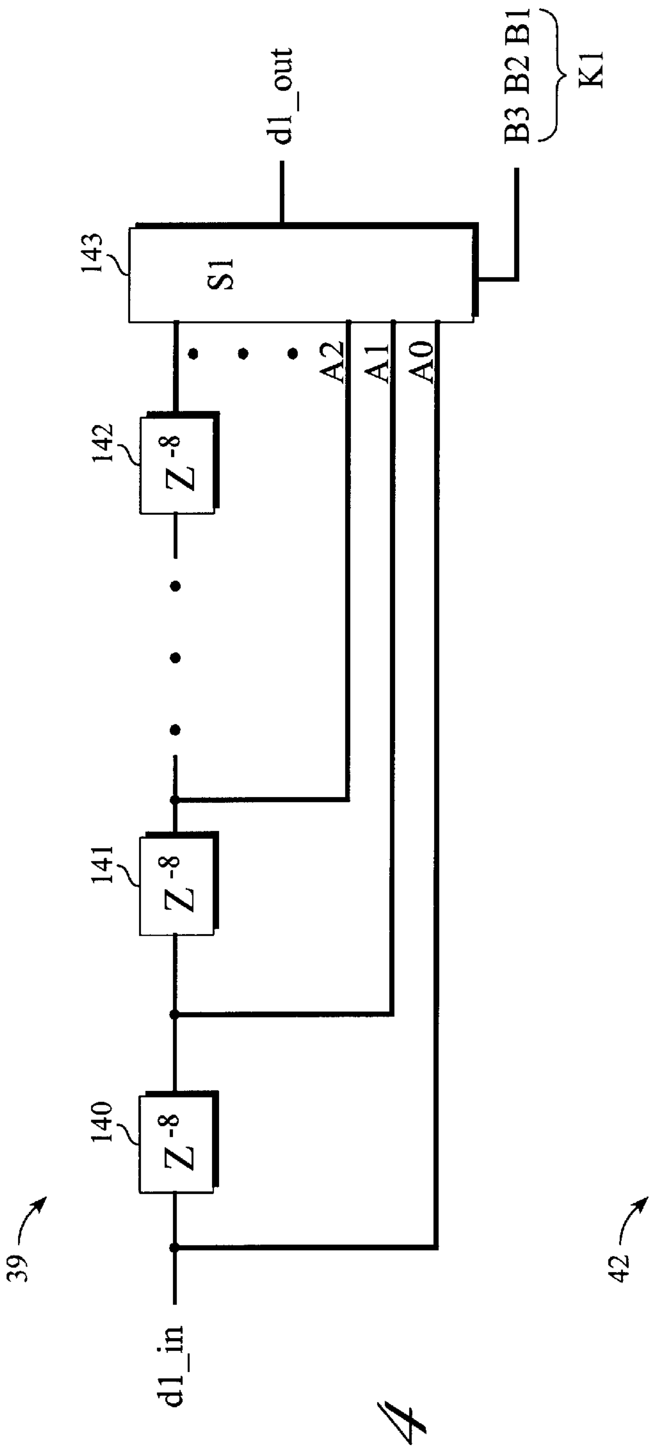
FIG. 4 is an uncorrected current channel in an ADC converter system, according to the prior art.

Referring now to FIG. 4, there is shown a diagram of first delay cell d1 39 according to the present invention. The first delay cell d1 includes delay elements 140–142 and a selector element 143 connected to elements 140–142. The selector element S1 chooses a delayed version of d1_in and passes it to d1_out. The delay is $k1z^{-8}$, where k1 is programmable to the values 0,1,7. $z^{-8}$represents an 8 clock delay. At frequency f, this is equivalent to a delay of d1=8k1/f. For example, with f=512 kHz and k1=3, d1=46.875 microseconds. Each register is a single bit element, since the data comes directly from the modulator. Implementing the majority of the delay with single bits results in substantial silicon savings.

Figure 5:
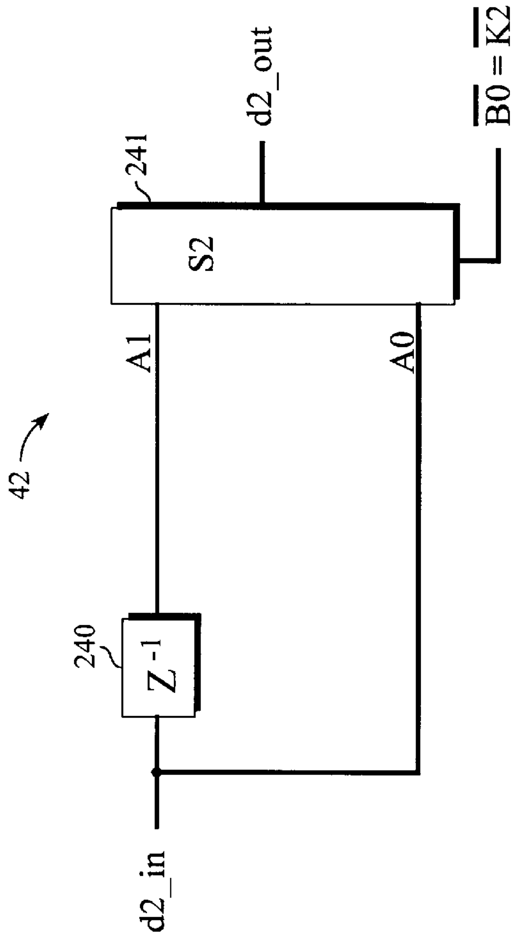
FIG. 5 is a corrected voltage channel in an ADC converter system having first through third clock speeds (e.g., HICLK, MDCLK, and LOCLK), according to the present invention.

Referring now to FIG. 5, there is shown a diagram of delay cell d2 42 according to the present invention. The second delay cell d2 42 includes a delay element 240 and a selector element 241 connected to the delay element 240. The selector element S2 241 chooses a delayed version of d2_in and passes it out as d2_out. The delay will be $k2*z^{-1}$, where k2 is programmable to the values 0 or 1. $z^{-1}$ represents a one clock delay. At the frequency f/64, this is equivalent to a delay of d2=64*k2/f. For example, with f=512 kHz and k2=1, d2=125 microseconds. The savings in area by delaying single bits, diminishes for large values of required delay. For this reason some of the delay was implemented at this lower frequency. The implementation is optimal for the given system. The total delay in the voltage channel is d1+d2=8k1/f+64k2/f=1/f(8k1+64k2). Therefore, dt (relative to current channel) is 64/f−(d1+d2)=1/f(64−8k1−64k2) for k1=0,1, . . . ,7 an The range of correction is 64/f to −56/f with a resolution of 8/f.

Figures 6A, 6B:
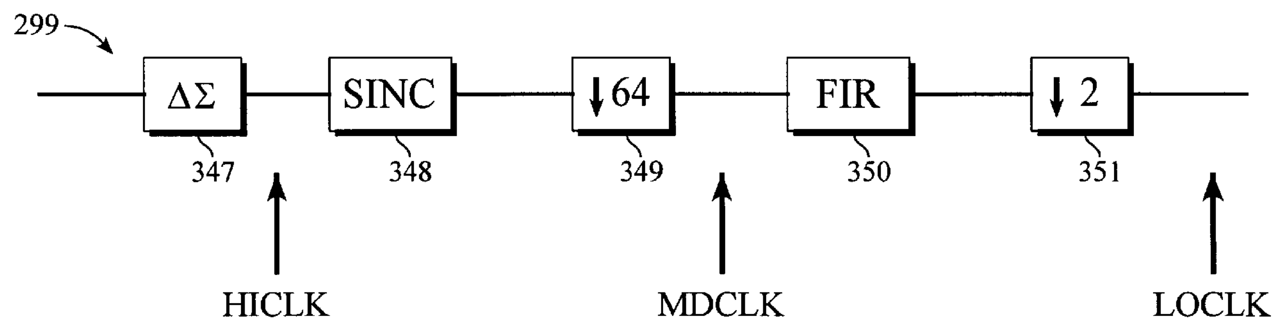
FIG. 6A is an uncompensated signal process flow according to the present invention.
FIG. 6B is a chart showing the phase delay that can be introduced by various clocks. It is expressing the relationship of selected first through third DCLK values and first and second selected signal frequencies (fsig), to respective phase/HICLK, phase/MDCLK, and phase/LOCLK values.

Referring now to FIG. 6A, there is shown a phase compensation system 299 according to the present invention. In particular, the phase compensation system 299 includes a delta sigma analog to digital converter 347, a sinc filter 348, a first decimator 349, a FIR filter block 350, and a second decimator 351. In FIG. 6A, the HICLK=DCLK/8. The MDCLK=DCLK/512. The LOCLK=DCLK/1024. f is the frequency of the modulator sampling at 512 kHz for example. The range of correction ensures that 64/f corresponds to an amount of time enabling delay of two channels by a specific amount of time. The maximum and minimum amounts of delay are 64/f (leading) and −56/f (lagging). To implement a phase compensation calculation according to the present invention, a sinc function is used as a filter function to eliminate quantization noise introduced by the delta-sigma converter 347. Reduction of noise is accomplished by a factor of 64 by downsampling resulting from the earlier oversampling. The FIR 350 in FIG. 6A corrects for the attenuation by the sinc low pass filter 348. The FIR 350 attenuates noise as well as information signals. When the sinc low pass filter 348 operates at high frequency with attenuation being substantial, both signal and noise components are reduced. No signals are transmitted at that frequency range, however. However, at the low frequencies where the signal is, the attenuation droops slowly, rolling off very gradually from DC levels. With non-DC signals such as a power signal, a slight filter rolloff results in different attenuation at 50 Hz than at 60 Hz (or for example at 100 Hz versus 200 Hz). In a noise reduction filter, it is desirable that any signal, irrespective of frequency, will have the same gain. The FIR 350 does the opposite of the roll off of the sinc, i.e., the FIR 350 corrects for the gain error. The two filters 348, 350 combined do not introduce any substantial gain error as frequency shifts between 1 Hz, 10 Hz, or 100 Hz.

Referring now to FIG. 6B, there is shown a chart relating selected DCLK and signal frequencies (fsig) to the phase shift that can be introduced by various clocks HICLK, MDCLK, and LOCLK. According to one aspect of the invention, the required range for compensating current transformers is plus or minus one to two degrees. This is accomplished with one MDCLK and 64 HICLKS.

FSIG is the input signal. Depending on the signal frequency (e.g., 50 or 60 Hz), a particular time represents a particular amount of phase. For example, for a signal frequency of 50 Hz, a corresponding amount of time may represent 180 degrees of phase. On the other hand, a 100 Hz input may represent 380 degrees of phase. For the indicated values of DCLK, the operating range according to the present invention is ±2.5 degrees, which requires a programmable delay of 0 to 5 degrees. After the operating ranges have been established in the first 2 columns, the calculated phases for hi, mid, and low clocks are shown. From this information, it is clear that the low clock is too slow (5–10 degrees). It moves too much with each clock. With the mid clocks plus a few high clocks, a workable result is achieved. With a high clock, the data is in single bit, because coming out of the delta-sigma, there is just either a one (1) or a zero (0). With Mdclock, the word length is up to 16 bits, and to generate such delays is costly. To generate one unit of delay with a mid clock, 16 registers are used compared to generating one unit of delay at the high clock, where only one extra register is required. The disadvantage of generating a similar delay at high clock compared to at mid clock, more delay blocks (stages) (e.g., $z^8$) are needed. Even with one register, 64 stages are needed to get one which would be obtained at the mid clock. In general, to generate a delay, the 16 bits are copied 10 times like a shift register. This results in a signal delay of 10 units of time. Accordingly, to generate a 1 unit of time delay at a selected mid clock rate, just one extra register bank is needed, wherein the one register used may be 16 bits wide one register is used. At a low clock rate, one of the design rules is not to apply a phase shift of much more than ±2.5 degrees. This ±2.5 degree range is with an added safety factor, because the actual range is only ±1 to ±2 degrees. The delay is inserted at two places because it is known what kind of delay is desired, the resolution is known, the dynamic range is known. In addition, it is desired to optimize the design based on total silicon area. In the initial preferred embodiment the delay is broken into two places. For example if the word width is 32 instead of 16 bits wide, it is anticipated that the delays would be reconfigured.

Figure 7A:
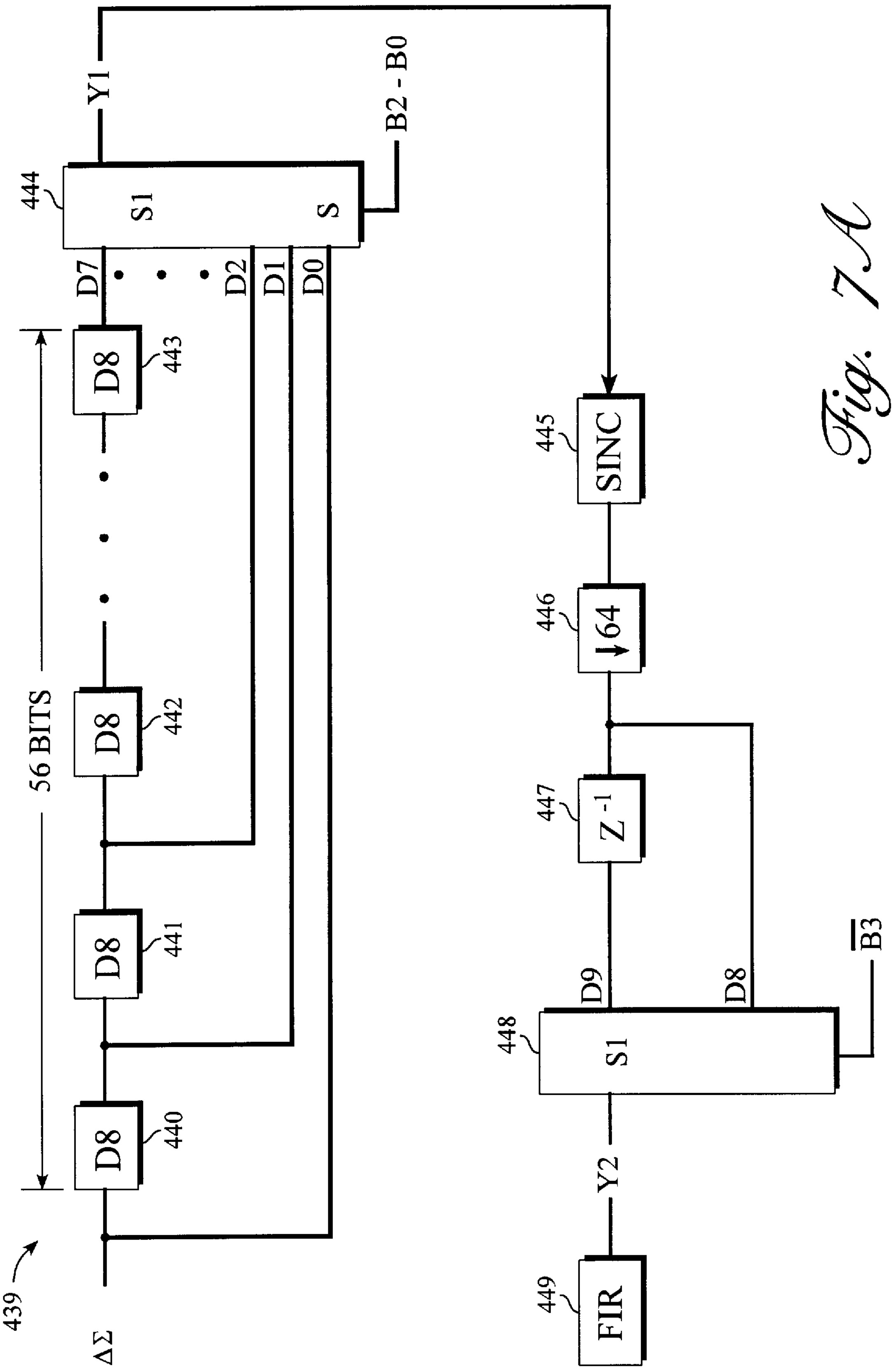
FIG. 7A is a phase compensation system according to the present invention.

Referring now to FIG. 7A, there is shown a phase compensation delay cell d1 39 according to the present invention. The first delay cell d1 includes z elements 140–142 and a selector element 143. The selector element S1 chooses a delayed version of d1,in and passes it to d1,out. The delay is (k1) * ($z^{-8}$), where k1 is programmable to the values 0,1,7. $Z^{-8}$ represents an 8 clock delay. At frequency f, this is equivalent to a delay of d1=8k1/f For example, with f=512 kHz and k1=3, d1=46.875 microseconds. Each register is a single bit element, since the data comes directly from the modulator. Implementing the majority of the delay with single bits results in substantial silicon savings.

Referring now to FIG. 7B, there is shown a chart relating values of B3B2B1B0 to Y2, Y1, total DELAY, and delay normalized to B=0.

Figure 8A:
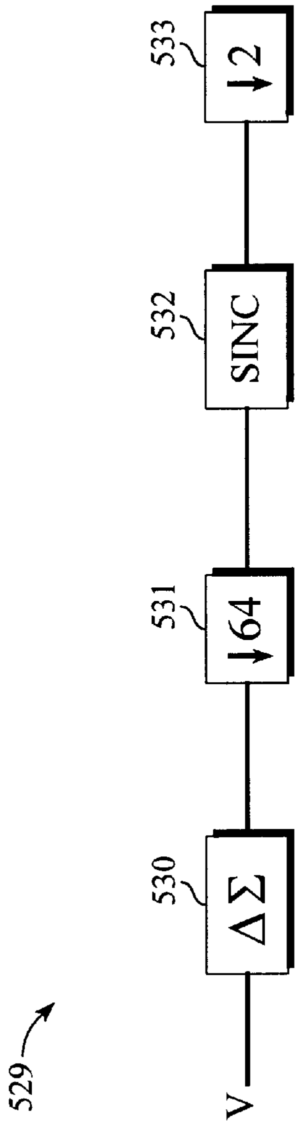
FIG. 8A shows the delay and decimation of the voltage channel signal path according to the present invention.

Referring now to FIG. 8A, there is shown a delayed voltage channel 529 according to the present invention. The delayed voltage channel 529 includes a delay element 530, a decimator 531, a second delay element 532, and a second decimator 533. The Figure shows the total channel delay without phase compensation.

Figure 8B:
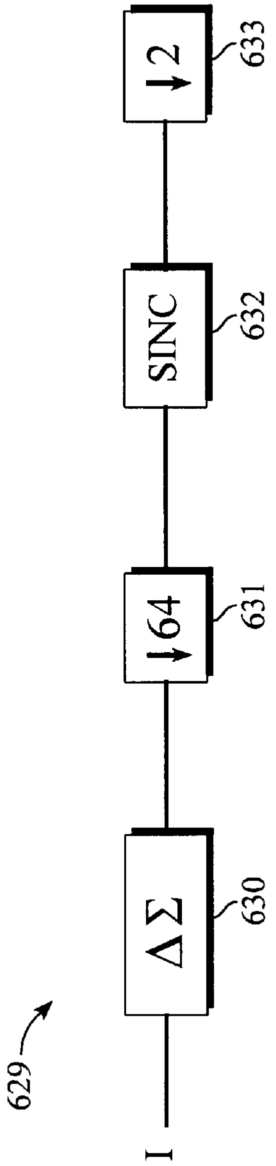
FIG. 8B shows the delay and decimation of the current channel signal path according to the present invention.

Referring now to FIG. 8B, there is shown a delayed current channel according to the present invention. The delayed current channel 629 includes a delay element 630, a decimator 631, a second delay element 632, and a second decimator 633. The Figure shows the total channel delay without phase compensation.

What is claimed is:

1. A delay correction system for a dual-channel analog-to-digital converter (ADC) system including a voltage channel, said delay correction system comprising:

a first programmable register delay element in a voltage channel portion;

the first programmable register delay element operating at a first data rate;

a first decimation mechanism for reducing said first data rate in a voltage channel;

a second programmable register delay element connected in a voltage channel portion operating at a data rate reduced from said first data rate;

first and second delta-sigma analog-to-digital converters;

a second decimation mechanism for reducing an input data rate in a current channel associated with said voltage channel; and a multiplication node connected to said voltage and said current channels for combining signal outputs with the reduced data rate of both the current and the voltage channels.

2. The delay correction system according to claim 1 wherein said first and second delta sigma analog-to-digital converters are configured to convert analog signals received from the respective voltage and current delays at a first data rate.

3. The delay correction system according to claim 1 wherein the multiplication node is connected to the output of the second programmable register delay element.

4. The delay correction system according to claim 1 including a summation block is connected to the output of the multiplication node.

5. The delay correction system according to claim 1 wherein the data rate is stepped down by a factor of 64 by a data rate decimation mechanism.

6. The delay compensation system according to claim 1 wherein the data rate is stepped down by the factor of 64 between the first and second programmable register delay elements.

7. The delay correction system according to claim 1 wherein only one path of the delay correction system is compensated.

8. The delay correction system according to claim 1 wherein the voltage channel is selected for incorporation of delay elements, because its resolution is not as great as the resolution of the current channel, therefore requiring less silicon area for delay registers.

9. The delay correction system according to claim 1 wherein the clock rates for the delay registers are f and f/64 respectively.

10. The delay correction system according to claim 1 wherein the summation block produces an output energy signal value based upon sampled data.

11. The delay correction system according to claim 1 wherein the respective phases corresponding to the two channels are substantially equal and wherein one of the two channels is adjusted to enable calibrating out errors that are externally derived with respect to the ADC.

12. The delay correction system according to claim 1 wherein the first and second ADCs use different filters, each of which is provided with a separate adjustment delay on at least one channel for each filter to ensure phase adjustment between channels.

13. A method for improving a phase correction in a voltage channel of an energy measurement system, the method comprising:

providing a coarse delay correction wherein the coarse delay correction is preceded by a decimating filter and followed by a data rate reduction; and providing a fine delay correction.

14. A method for improving a phase correction in a voltage channel of an energy measurement system, the method comprising:

providing a coarse delay correction; and providing a fine delay correction wherein the fine delay correction is preceded by a decimating filter and preceded by a data rate reduction filter.

15. A digital filter system comprising:

a first filter mechanism configured to receive a digital signal input at a first data rate at an input and to produce an output digital signal at a second data rate at an output;

a first delay mechanism connected to the input of said first filter mechanism and adapted to apply a selectable first delay amount to a digital signal input at a first data rate; and a second delay mechanism connected to the output of said first filter mechanism and adapted to apply a selectable second delay amount to an output digital signal at a second data rate.

16. The digital filter system according to claim 15 further comprising a second filter mechanism configured to receive a digital signal input at said second data rate and to produce an output digital signal at a third data rate.

17. The digital filter system according to claim 15 wherein said first delay mechanism includes:

an N number of delay elements;

an N+1 number of nodes connected respectively in series with corresponding ones of said N number of delay elements, wherein N is a selected integer value and wherein the first and second of said N+1 number of nodes are respectively connected on opposite sides for the first of said N number of delay elements; and a multiplexer connected at its input to each of said N+1 number of nodes and configured to select one of said N+1 number of nodes for provision of an output signal based upon an input signal delayed by an amount corresponding to the number of delay elements connected prior to the selected one of said N+1 number of nodes.

18. The digital filter system according to claim 15 wherein said second delay mechanism includes:

a single delay element;

first and second nodes connected in series with said single delay element; and a multiplexer connected at its input to each of said first and second nodes and configured to select one of said first and second nodes for provision of an output signal based upon an input signal delayed by an amount corresponding to whether a delay element is connected prior to the selected one of said first and second nodes.

19. A digital filter system comprising:

a first filter mechanism configured to receive a digital signal input at a first data rate and to produce an output digital signal at a second data rate;

a first delay mechanism connected to said first filter mechanism and adapted to apply a selectable first delay amount to a digital signal input at a first data rate; and a second delay mechanism connected to said first filter mechanism and adapted to apply a selectable second delay amount to an output digital signal at a second data rate;

wherein said first delay mechanism includes an N number of delay elements;

an N+1 number of nodes connected respectively in series with corresponding ones of said N number of delay elements, wherein N is a selected integer value and wherein the first and second of said f N+1 number of nodes are respectively connected on opposite sides for the first of said N number of delay elements; and a multiplexer connected at its input to each of said N+1 number of nodes and configured to select one of said N+1 number of nodes for provision of an output signal based upon an input signal delayed by an amount corresponding to the number of delay elements connected prior to the selected one of said N+1 number of nodes;

wherein said second delay mechanism includes a single delay element;

first and second nodes connected in series with said single delay element; and a multiplexer connected at its input to each of said first and second nodes and configured to select one of said first and second nodes for provision of an output signal based upon an input signal delayed by an amount corresponding to whether a delay element is connected prior to the selected one of said first and second nodes.

20. A phase compensation system for a dual-channel analog-to-digital converter (ADC) system including a voltage channel and a current channel, said phase compensation system comprising:

a first programmable delay element in a voltage channel;

a second programmable delay element in another voltage channel;

a voltage delay; a current delay; first and second delta-sigma analog-to-digital converters (ADCs); first and second decimators, a multiplication node; and a summation block.

21. The phase compensation system according to claim 20 wherein said delta sigma analog to digital converters are configured to convert analog signals received from the respective voltage and current delays at a first data rate.

22. The phase compensation system according to claim 20 wherein a data rate is stepped down by a factor of 64 by the respective first and second decimators.

23. The phase compensation system according to claim 20 wherein a data rate is stepped down by the factor of 64 between the first and second programmable delay elements.

24. The phase compensation system according to claim 20 wherein only one path of the delay correction system is compensated.

25. The phase compensation system according to claim 20 wherein the voltage channel is selected for incorporation of delay elements, because its resolution is not as great at the resolution of the current channel, therefore requiring less silicon area for delay registers.

26. The phase compensation system according to claim 20 wherein clock rates for the first and second programmable delay elements are f and f/64 respectively.

27. The phase compensation system according to claim 20 wherein the multiplication node is connected to outputs of the second delay element and an output of a delay register.

28. The phase compensation system according to claim 20 wherein the summation block is connected to an output of the multiplication node.

29. The phase compensation system according to claim 20 wherein the summation block produces an output energy signal value based upon sampled data.

30. The phase compensation system according to claim 20 wherein the respective phases corresponding to the two channels are substantially equal and wherein one of the two channels is adjusted to enable calibrating out errors that are externally derived with respect to the ADC.

31. The phase compensation system according to claim 20 wherein the first and second ADCs use different filters, each of which is provided with a separate adjustment delay on at least one channel for each filter to ensure phase adjustment according to the present invention.

* * * * *